United States Patent [19]
Feldman et al.

[11] Patent Number: 5,860,815
[45] Date of Patent: Jan. 19, 1999

[54] EDGE MOUNT CONNECTOR HAVING LOCATION RECESSES FOR SOLDER TAIL REGISTRATION

[75] Inventors: Steven Feldman, Madison; James C. Pilny, Mentor, both of Ohio; Dennis M. Brunner, Centralia, Mo.

[73] Assignee: Minnesota Mining and Manufacturing Company, St. Paul, Minn.

[21] Appl. No.: 804,207

[22] Filed: Feb. 21, 1997

[51] Int. Cl.$^6$ ...................................................... H01R 9/09
[52] U.S. Cl. .................................................................. 439/79
[58] Field of Search .................................... 439/79, 59, 78, 439/80, 81, 83, 84, 325, 329, 629, 76.1; 29/829, 840, 843, 832, 834

[56] References Cited

U.S. PATENT DOCUMENTS

| | | | |
|---|---|---|---|
| 4,479,686 | 10/1984 | Hoshino et al. | 339/17 |
| 4,708,415 | 11/1987 | White | 439/633 |
| 4,717,218 | 1/1988 | Ratcliff | 439/59 |
| 5,277,596 | 1/1994 | Dixon . | |
| 5,413,490 | 5/1995 | Tan et al. | 439/76.1 |
| 5,504,994 | 4/1996 | Banakis et al. . | |
| 5,505,628 | 4/1996 | Ramey et al. | 439/76.1 |
| 5,575,663 | 11/1996 | Broschard, III et al. . | |

*Primary Examiner*—Gary Paumen
*Assistant Examiner*—Yong Ki Kim
*Attorney, Agent, or Firm*—Matthew B. McNutt

[57] ABSTRACT

An edge mount connector includes a connector body having solder tails extending from a back side, and receptacles formed in a front side, opposite the back side. The solder tails have terminal ends aligned along a solder plane extending through the front and back sides and intersecting the body between a top and a bottom surface. Recesses are integrally formed to extend into the front and bottom sides of the body. The recesses include a rest surface extending along the solder plane. The connector body is suspended within a cut-out formed in a circuit board panel. The body is maintained substantially level with the solder tails engaging solder pads formed on one portion of the panel whereas another portion of the circuit board panel adjacent the cut-out, is simultaneously in engagement with the rest surfaces of the recesses.

15 Claims, 4 Drawing Sheets

EDGE MOUNT CONNECTOR HAVING LOCATION RECESSES FOR SOLDER TAIL REGISTRATION

BACKGROUND

The disclosures herein relate generally to an edge mountable connector for a printed circuit board and more particularly to support the connector so that solder tails are positioned for surface mount soldering to the board without the need for clamps or fixtures.

In the process of attaching an edge mountable connector to a printed circuit board (PCB), a circuit board panel supports the PCB by means of frangible members which interconnect the panel and peripheral or edge portions of the PCB. One of the edge portions of the PCB includes an array of solder pads which interconnect with conductive paths on the PCB. Immediately adjacent the solder pads, an enlarged cut-out portion is provided for inserting the connector. The connector includes a plurality of solder tails. When the connector is inserted into the cut-out portion, the solder tails are aligned in contact with the solder pads so that a subsequent soldering operation can provide the required connection between the aligned tails and pads.

Preferably, placement of the connector in position for soldering is accomplished by pick-and-place automation. To assure the success of the automated procedure, certain conditions must be satisfied. First, the connector must be seated in the cut-out portion so that the solder tails are aligned with the solder pads. This orientation or registration of tails-to-pads is part of the pick-and-place automation operation. Second, placement of the connector in the cut-out requires some means of seating the connector so that it does not drop completely through the cut-out. A prior solution to this problem included the placement of ears on opposite ends of the connector. The ears extend from the connector and seat on a top surface of the panel adjacent the cut-out, thus suspending the connector body within the cut-out. Next, the connector must be seated and supported in the cut-out so that the solder tails are on the same plane as the solder pads placing the tails and pads in contact preparatory to the actual soldering step. To satisfy this requirement, one approach has been to provide a seating surface on the ears which engages the panel top surface such that the connector is supported within the cut-out at a level which places the solder tails and solder pads in planar contact. Last, due to the center of gravity (CG) of the connector being off center (i.e. a substantial mass of the contacts is housed within the connector and displaced from the solder tail portion of the contact) the connector has a tendency to tip away from the PCB while it is supported on the panel by the ears. The tipping therefore causes the solder tails to tip up and out of contact with the solder pads. This is because the CG is displaced from the ears. As a result, clamps and fixtures must be applied to maintain the seated connector in the proper position so that the solder tails remain in contact with the solder pads for the soldering operation. These clamps and fixtures are manually applied thus defeating the complete automation of the procedure.

A limitation of using ears to support the connector in the cut-out is that due to the demand for a variety of connectors, each with solder tails at different offsets from the connector body centerline, many different offsets are required of the ear geometry. Incorporating interchangeable ear height features in mold tooling presents technical difficulties and/or is economically not feasible. It is usual, in the injection molding process, to gate on the end of an ear. Thus, building a mold with quick-change features for ear height adjustment requires the added expense of providing many gate inserts and increases changeover time. Furthermore, some desirable tail offsets would require decreasing ear thickness which would also decrease the gate area to the point of preventing proper mold fill. Another tooling disadvantage is that the ears can provide a bearing surface for ejecting the connector body from the mold. Thus, mold complexity is greatly increased when variable ejector positions, resulting from variable ear geometry, must be included in interchangeable tooling.

Therefore, what is needed is an apparatus and method for supporting a connector within a cut-out in a manner which orients the solder tails in planar position and contact registration with the solder pads for completing the soldering operation, which avoids connector tipping and the need for clamps and fixtures, and which also avoids the limitations and complexities associated with molding and ejecting the connectors of varying geometry and the associated tooling problems and expenses connected therewith.

SUMMARY

One embodiment accordingly, provides a connector geometry which is supported in the cut-out in a manner which avoids the above-mentioned problems. To this end, an edge mount connector includes a connector body having a plurality of solder tails extending from a back side of the body, and a plurality of receptacles formed in a front side of the body, opposite the back side. The solder tails have terminal ends aligned along a solder plane extending through the front and back sides and intersecting the body between a top and a bottom surface. The front side has at least one front facing recess formed therein. The recess also incorporates a portion of the bottom surface of the body and includes a rest surface extending along the solder plane.

A principal advantage of this embodiment is that an edge mount connector can be attached to a PCB in a completely automated pick-and-place operation due to the connector being supported in a manner which obviates tipping and provides solder plane support at the front and back sides of the connector.

DESCRIPTION OF THE PREFERRED EMBODIMENT

Figure 1:
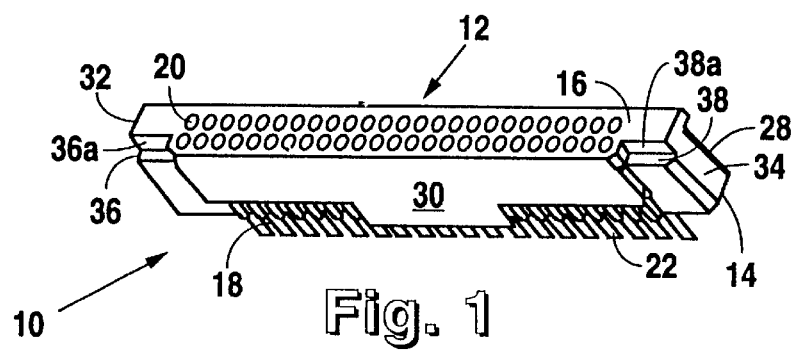
FIG. 1 is an isometric view illustrating an embodiment of an edge mount connector.

Referring to FIG. 1, an edge mount connector is generally designated 10 including a connector body 12, formed of a dielectric material such as plastic and having a back side 14 and a front side 16. A plurality of solder tails 18 extend from back side 14 and include portions (not shown) which are seated within body 12 in a plurality of female receptacles 20 formed in front side 16. Receptacles 20 are provided for subsequent electrical connection to an external plug (not shown). The solder tails 18 are provided with terminal ends 22 for electrical soldered connection to respective solder pads 24 on an associated PCB 26, FIG. 2. In this manner, the external plug is electrically connectable to the PCB 26.

Figure 2:
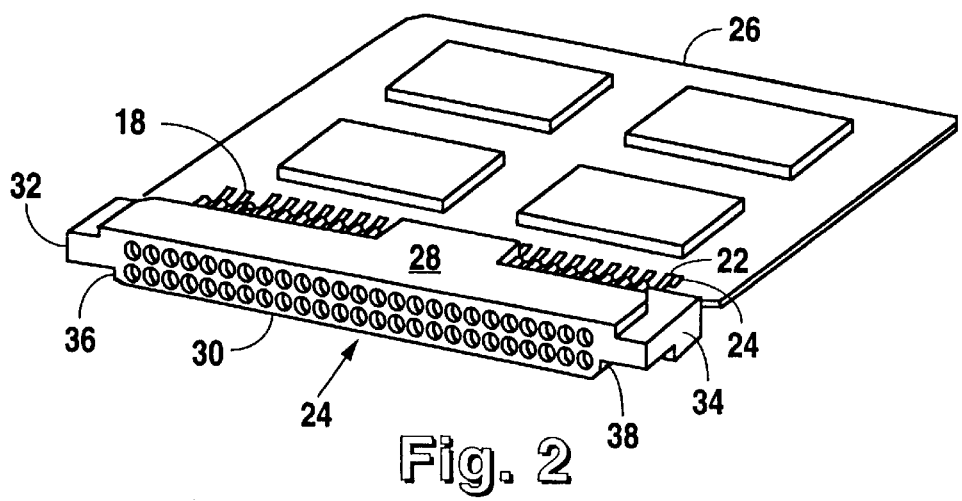
FIG. 2 is an isometric view illustrating an embodiment of the connector of FIG. 1, mounted on an edge of an associated printed circuit board.
Figure 3:
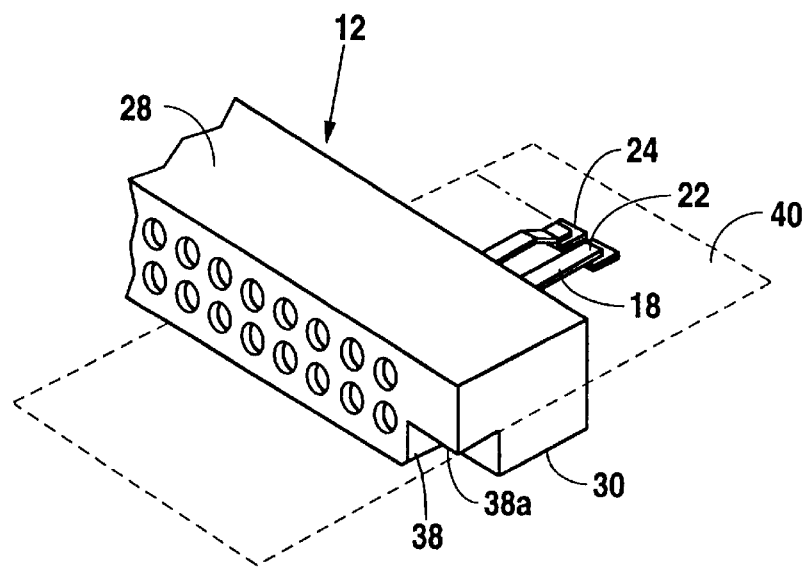
FIG. 3 is a partial isometric view illustrating an embodiment of an edge mount connector.
Figure 4:
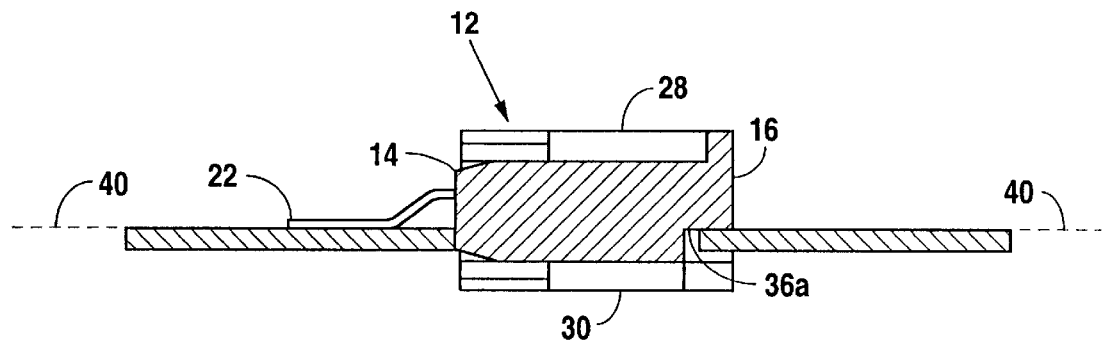
FIG. 4 is a cross-sectional side view illustrating an embodiment of the connector seated for mounting in a circuit panel.

Connector body 12, FIGS. 1 and 2, also includes a top surface 28, a bottom surface 30 and a pair of opposed end surfaces 32, 34. Front side 16 and bottom surface 30 include a pair of recesses 36, 38 integrally formed therewith. Recesses 36, 38 are spaced apart and are respectively adjacent the opposed end surfaces 32, 34. In fact, recesses 36, 38 are preferably integrally formed in body 12 with front side 16, end surfaces 32, 34 and bottom surface 30. In this manner, recesses 36, 38 each incorporate a portion of the front side, the bottom surface and a respective end surface. An imaginary plane 40, FIGS. 3 and 4, referred to herein as the solder plane, is projected through connector body 12 between and parallel with top surface 28 and bottom surface 30. Each recess 36, 38, see also FIG. 1, includes a respective planar rest surface 36a, 38a positioned on the solder plane 40. Terminal ends 22 and recess surfaces 36a, 38a, each extend substantially along solder plane 40. Slight variances of the terminal ends with respect to plane 40 may exist to allow for solder fillets and manufacturing tolerances.

Figure 5:
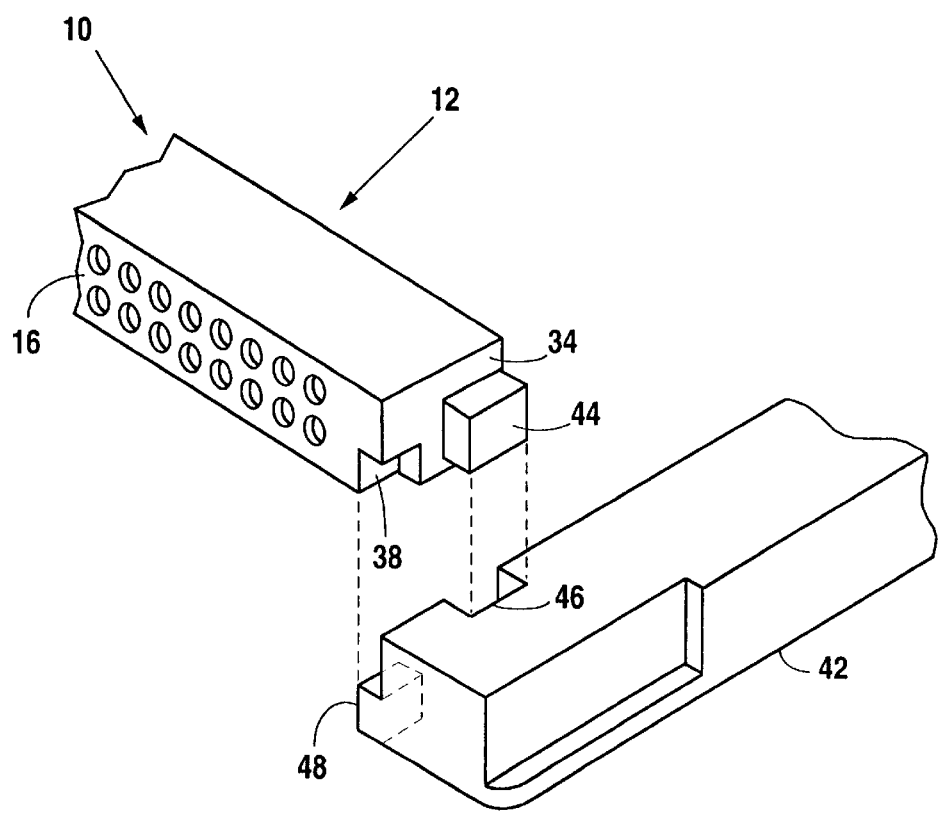
FIG. 5 is an isometric view illustrating an alternative embodiment of the connector in combination with a card frame.

When it is desired to use connector 10, FIG. 5, in combination with an associated integrated circuit card frame 42, a locking tab 44 may be formed on ends 34, 36 of connector body 12. Tab 44 may be engaged with a corresponding slot 46 formed in card frame 42 for receiving tab 44. The combination of tab 44 and slot 46 secures connector body 12 in frame 42. In FIG. 5, one such tab 44 is illustrated on end 34 for locking engagement with slot 46. A similar tab is provided on end 32, not shown. In view of the presence of front facing recesses 36, 38, visible in front side 16, cosmetic tabs 48 are provided to extend from frame 42 and are sized to fill recesses 36, 38. In FIG. 5, one such tab 48 is illustrated for cosmetic engagement with recess 38 on end 34. A similar tab is provided for engagement with recess 36 at end 32, not shown. In this manner, when connector 10 and frame 42 are engaged, recesses 36, 38 will be filled with respective tabs 48 and therefore will not be as noticeable.

Figure 6:
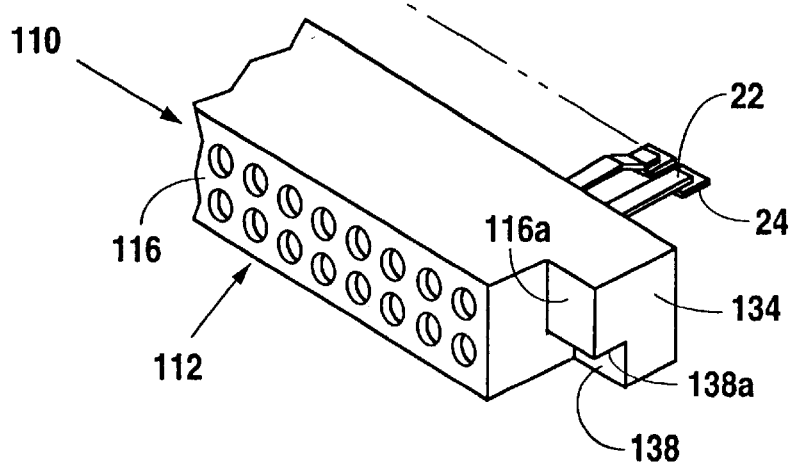
FIG. 6 is an isometric view illustrating an alternative embodiment of the connector.

In another embodiment, FIG. 6 connector body 110 includes a front facing recess 138 which includes all the features, including a planar surface 138a, described above with respect to recess 38, FIG. 1, however, recess 138, FIG. 6, has a face 116a set back from front face 116. Thus, recess 138 is formed by an "L" shaped tab extending end 134 from connector body 112.

Figure 7:
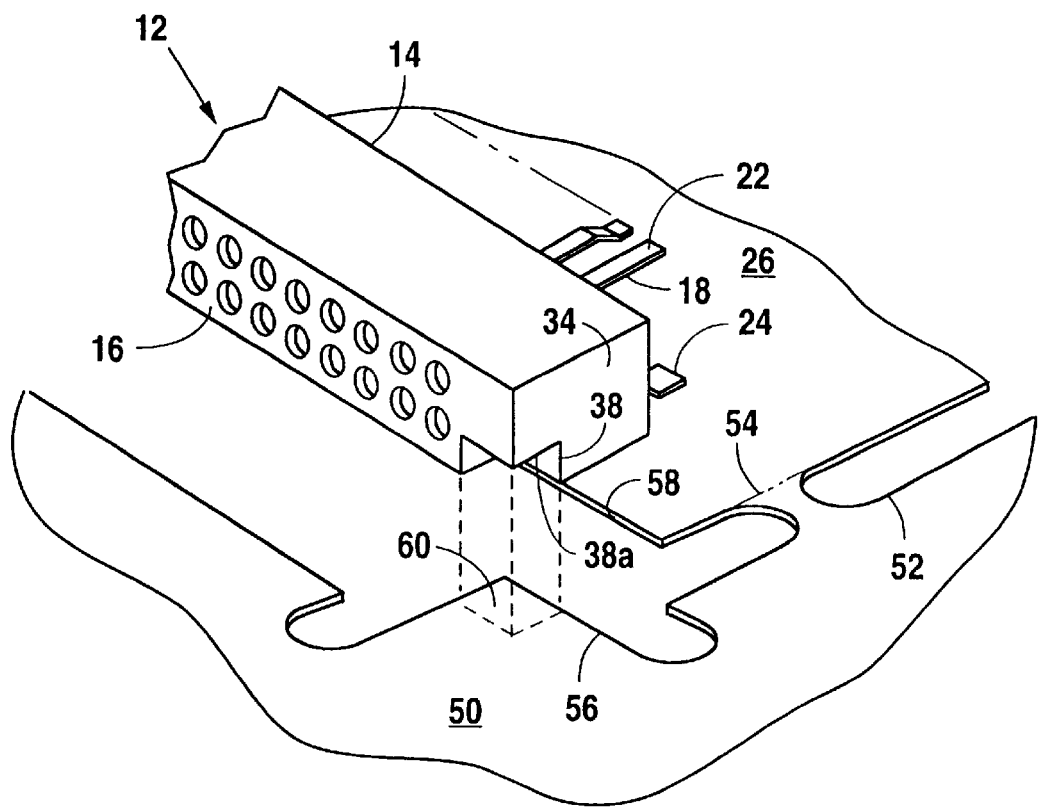
FIG. 7 is an isometric view illustrating an embodiment of the connector in relation to an associated circuit panel.
Figure 8:
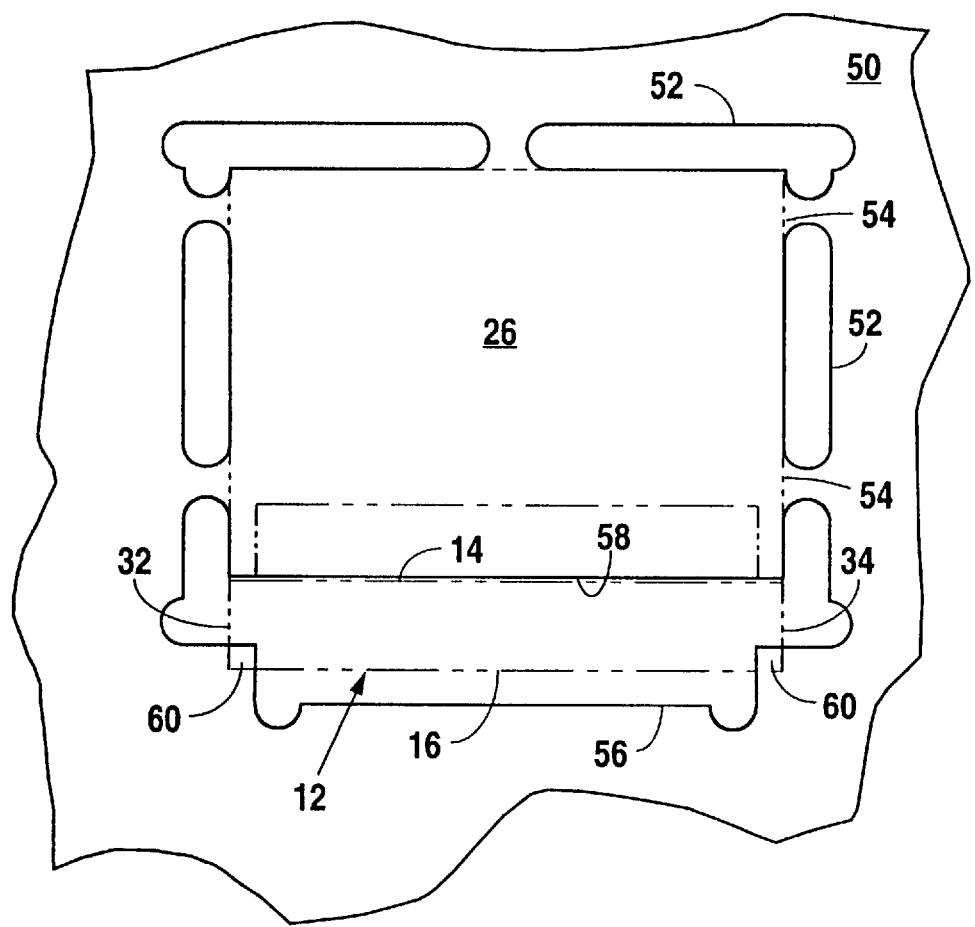
FIG. 8 is a diagrammatic view illustrating an embodiment of the connector to circuit panel relationship.

As it can be seen by referring to FIGS. 7 and 8, a circuit board panel 50 includes cut-outs 52 defining frangible portions 54 where the PCB 26 can be separated from panel 50. An enlarged connector cut-out 56 is provided for seating connector body 12 adjacent an edge 58 of PCB 26. An area 60 of panel 50 is provided to engage surfaces 36a, 38a of recesses 36, 38, respectively. This engagement of surfaces 36a, 38a with area 60 of panel 50, and the simultaneous engagement of solder tails 18 on PCB 26, provides a means of supporting connector body 12 within cut-out 56 so that tipping of connector body 12 is overcome. This is accomplished by the resulting support of connector body 12 adjacent front side 16 and back side 14 thus stabilizing body 12 in cut-out 56 for a subsequent soldering operation. In FIG. 7, one such area 60 is illustrated on end 34 for engagement with surface 38a of body 12. A similar arrangement is also provided at end 32, illustrated in FIG. 8, but not shown in FIG. 7.

In operation, it can be seen that when a connector 10 is to be seated in cut-out 56 by a pick-and-place operation, surfaces 36a, 38a of body 12, which extend along plane 40, engage respective areas 60 on circuit panel 50. This provides support at the front side 16 of connector body 12. Simultaneously, solder tails 18, which also extend along plane 40, engage PCB 26. This provides added support adjacent the back side 14 of body 12. In this manner, connector 12 is stabilized in cut-out 56 and solder tails 18 are positioned for a subsequent soldering operation to pads 24 of PCB 26. Thus, no clamping or other fixtures are required to maintain connector 10 in position for soldering after placement in cut-out 56.

A principal advantage is that these embodiments are applicable to male or female connectors which are mounted on a substrate edge. When a connector is positioned at the edge of a PCB 26 with solder tails 26 in registration with solder pads 24, the connector body 12 is supported at both of the front and back connector sides 16, 14, respectively. The recesses 36, 38 are formed into the front corners of the connector body 12. The recess height determined by surfaces 36a, 38a, is co-planar with solder tail terminal ends 20. Recesses 36, 38 are therefore on one side of the CG of body 12 whereas solder tail terminal ends 22 are on an opposite side of the CG, thus providing stability and parallel placement between body 12 and panel 50. This then requires no fixture or clamping of the connector 10 to panel 50. Pick-and-place automation of the connector 10 can be fully achieved. Another advantage of providing front facing connector body recesses 36, 38 is economy of manufacturing. Since the recess support must be coplanar with the terminal ends 22 of solder tails 18, and since the market typically requires a variety of connector configurations, each with solder tails at different body centerline offsets, building molds with quick change features to accommodate these different configurations requires the expense of many gate inserts. Recesses at the front of the connector body avoid circuit board fixturing expense, enable auto-assembly of the connector and circumvent the usual tooling complexity and cost associated with providing an interchangeable connector body support means. Because the described support features are recessed into the connector body 12 there is also no possibility of protruding members interfering with a mating connector.

Although illustrative embodiments of the invention have been shown and described, a wide range of modifications, change and substitution is contemplated in the foregoing disclosure and in some instances, some features of the present invention may be employed without a corresponding use of other features. Accordingly, it is appropriate that the appended claims be construed broadly and in a manner consistent with the scope of the invention.

What is claimed is:

1. An edge mount connector comprising:

a connector body having a plurality of solder tails extending from a back side of the body and a plurality of receptacles formed in a front side of the body, opposite the back side;

the solder tails having terminal ends aligned along a solder plane extending through the front and back sides and intersecting the body between a top and bottom surface; and the front side having at least one front facing recess formed therein, the recess also incorporating a portion of the bottom surface of the body, the recess having a rest surface positioned on the solder plane.

2. The connector as defined in claim 1 further comprising a second front facing recess formed in the front side, the one recess being spaced apart from the second recess.

3. The connector as defined in claim 2 further comprising a pair of opposed end surfaces, the recesses also incorporating a portion of the end surfaces.

4. The connector as defined in claim 3 further comprising an associated integrated circuit card frame, the connector having locking tabs on the end surfaces, the card frame including slots formed therein for receiving the locking tabs.

5. The connector as defined in claim 4, wherein the frame has cosmetic tabs extending therefrom for engagement with the recesses.

6. The connector as defined in claim 3 wherein the recesses are formed by "L" shaped tabs formed in the end surfaces.

7. An edge mount connector comprising:
a connector body having a plurality of solder tails extending from a back side of the body and a plurality of receptacles formed in a front side of the body, opposite the back side;
means for supporting the body in a substantially level plane within a cut-out formed in a circuit board panel, said means including the solder tails and also including the front side having at least one front facing recess formed therein; and
the recess also being integrally formed with a portion of an adjacent bottom surface of the body, the recess having a rest surface positioned on the plane.

8. The connector as defined in claim 7 further comprising a second front facing recess formed in the front side, the one recess being spaced apart from the second recess.

9. The connector as defined in claim 8 further comprising a pair of opposed end surfaces, the recesses also incorporating a portion of the end surfaces.

10. The connector as defined in claim 9 further comprising an associated integrated circuit card frame, the connector having locking tabs on the end surfaces, the card frame including slots formed therein for receiving the locking tabs.

11. The connector as defined in claim 10, wherein the frame has cosmetic tabs extending therefrom for engagement with the recesses.

12. The connector as defined in claim 9 wherein the recesses are formed by "L" shaped tabs formed in the end surfaces.

13. A method of mounting a connector body within a cut-out formed in a circuit board panel, the connector having a plurality of solder tails including terminal ends extending from a back side of the body to be soldered to solder pads on the circuit board panel, comprising the steps of:
providing at least one front facing recess formed in a front side of the body, opposite the back side, the recess being integrally formed with a portion of an adjacent bottom surface of the body;
providing a recess engaging surface on the circuit board panel along an edge of the cut-out adjacent the recess;
providing a rest surface of the recess aligned along a plane coincident with the circuit board panel and the terminal ends of the solder tails; and
engaging the solder tails with the solder pads simultaneously with engagement of the rest surface with the recess engaging surface.

14. The method as defined in claim 13 further comprising the step of providing a second front facing recess formed in the front side, the one recess being spaced apart from the second recess.

15. The method as defined in claim 14 further comprising the step of providing a pair of opposed end surfaces in the body, the recesses also incorporating a portion of the end surfaces.

* * * * *